United States Patent [19]
Creigh et al.

[11] Patent Number: 6,067,327
[45] Date of Patent: May 23, 2000

[54] DATA TRANSMITTER AND METHOD THEREFOR

[75] Inventors: John Lock Creigh, Raleigh, N.C.; Michel Ferry, Vallauris, France; Thomas Ashford Hughes, Jr., Apex; Scott David Huss, Raleigh, both of N.C.

[73] Assignee: International Business Machines Corporation, Armonk, N.Y.

[21] Appl. No.: 08/933,192

[22] Filed: Sep. 18, 1997

[51] Int. Cl.[7] .................................................. H04L 25/49
[52] U.S. Cl. .......................... 375/295; 375/296; 341/144; 708/315
[58] Field of Search ..................................... 375/295, 296; 708/319, 315, 300; 341/143, 144

[56] References Cited

U.S. PATENT DOCUMENTS

| | | | |
|---|---|---|---|
| 3,500,215 | 3/1970 | Leuthold et al. | 327/552 |
| 4,047,002 | 9/1977 | Sloane et al. | |
| 4,056,163 | 11/1977 | Wood et al. | |
| 4,290,050 | 9/1981 | Stakhov . | |
| 4,334,277 | 6/1982 | Bond et al. | |
| 4,396,906 | 8/1983 | Weaver . | |
| 4,503,510 | 3/1985 | Weaver . | |
| 4,819,197 | 4/1989 | Blais | 708/207 |
| 5,012,245 | 4/1991 | Scott et al. | 341/150 |
| 5,103,229 | 4/1992 | Ribner | 341/143 |
| 5,355,134 | 10/1994 | Kasuga et al. | 341/144 |
| 5,627,538 | 5/1997 | Ferry | 341/144 |
| 5,834,986 | 11/1998 | Myers | 332/100 |

*Primary Examiner*—Stephen Chin
*Assistant Examiner*—Chieh M. Fan
*Attorney, Agent, or Firm*—Daniel E. McConnell; Winstead, Sechrest & Minick

[57] ABSTRACT

A data transmitter is provided which performs digital to analog conversion, convolution with an arbitrary finite impulse response, and smoothing of the output functions without requiring a separate anti-aliasing low pass filter. To implement the data transmitter, a digital input data value is convolved with a desired impulse response. The coefficients of the desired finite impulse response filter are chosen to create a first or second derivative of an output of the data transmitter. Then, the derivative is integrated so that a resulting signal output from the data transmitter is a smooth signal which does not require further filtering.

27 Claims, 9 Drawing Sheets

DATA TRANSMITTER AND METHOD THEREFOR

CROSS-REFERENCE TO RELATED APPLICATION

This application is related to our commonly assigned, patent application entitled:
"CONVOLUTIONAL DIGITAL TO ANALOG CONVERTER", by Michel Ferry, filed Jan. 4, 1995, application Ser. No. 368,199, and now issued on May 6, 1997 as U.S. Pat. No. 5,627,538, and incorporated by reference herein.

TECHNICAL FIELD

The present invention relates in general to a digital data transmitter, and in particular, to data waveform shaping for a digital data communications transmitter.

BACKGROUND INFORMATION

Data transmitters often implement a convolutional generator which generates a same shape as a given impulse response of a desired transmit filter. Such filters are used to reduce the high frequency content of the transmitted signals to reduce radiated emissions and to pulse shape the signal to a desired shape to reduce inter-symbol interference. When a data transmitter converter is used to perform this convolutional generation, the given impulse response is "time sliced" and switched sources which have a value of the response at a different time are implemented. Each of the switched sources is subsequently used to generate a desired output waveform. While this solution works well in most situations, the staircase approximation of the impulse response generated when a conventional data transmitter is utilized results in spurious high frequency harmonic content. For this reason, a conventional data transmitter is typically followed by a complex low pass filter which is used to smooth the output of the data transmitter. For more information on such low pass filters, refer to *Modern Filter Design*, by M. S. Gausi, et al., and published by Prentice Hall in 1981. The requirement that such a low pass filter be implemented increases the complexity associated with the data transmitter. Additionally, a convolutional data transmitter may be implemented to provide both a conversion and a filtering function. Implementations of convolutional data transmitters typically comprise a multi-phase analog generator which shapes an impulse response (and hence the transfer function) of the data transmitter.

The circuits and systems described above are implemented in a typical transmitter. Such traditional methods of implementing a transmitter include the steps of up-sampling a digital data stream, filtering the data stream with a digital finite impulse response (FIR) transmit filter, converting the signal to an analog signal, and smoothing the output signal with an analog low-pass filter. A traditional transmitter is well-known in the data processing art. It is also well-known that this type transmitter requires a large over-sampling factor and an accurate complex analog filter to shape a pulse provided in a pass band of the digital FIR transmit filter. This over-sampling is problematic because large oversampling rates require high speed complex digital signal processing circuits which may not be implemented in many semiconductor process due to speed, power, and area limitations. In other well-known implementations, the over-sampling factor may be eliminated, and all of the pulse shaping and filtering is performed with an analog filter as illustrated in FIG. 1. However, this second implementation requires a very complex and accurate analog filter which is difficult to implement.

Furthermore, U.S. Pat. No. 5,355,134 by Kasuga, et al., entitled "Digital to Analog Converter Circuit", describes a D/A converter, a form of digital transmitter, whose output is smoothed with the use of a first order integration operation. In the D/A converter proposed by Kasuga, et al., two D/A converters are used to provide two output currents, one of which is inverted and delayed from the other. The output currents are then summed and integrated with the use of a capacitor. While the conventional D/A converter presented by Kasuga, et al. smoothes the output of a conventional D/A converter with a first order integration, the number of D/A converters required to perform this function is more complex and requires a substantial amount of power. Furthermore, the D/A converter proposed by Kasuga, et al. only describes how to implement first order integration and is, therefore, not able to reduce a high frequency content of the signal as much as is desirable. Such a reduction in the high frequency content is only available when a second order integration is used. Additionally, a prior art reference which attempts to address this issue is U.S. Pat. No. 5,008,674 by Da Franca, et al. However, U.S. Pat. No. 5,008,674 uses switched-capacitor filters and, therefore, is only useful for lower frequencies.

Therefore, it is desirable to have a data transmitter which is able to provide a smoother converter output without the overhead associated with additional low pass filters or with multiple D/A converters and data transmitters.

SUMMARY OF THE INVENTION

The previously mentioned needs are fulfilled with the present invention. Accordingly, there is provided, in a first form, a data transmitter. The data transmitter includes an input circuit for receiving an input signal. The data transmitter also includes a filter circuit for calculating a convolution of the input signal and a derivative of a desired impulse response of the data transmitter. The filter circuit is connected to the input circuit for receiving the input signal and providing an intermediate output signal. An integrator is connected to the filter for receiving the intermediate output circuit. The integrator integrates the intermediate output signal to provide an output signal having the desired impulse response of the data transmitter.

Additionally, there is provided, in a second form, a transmitter. The transmitter includes an input circuit for receiving a plurality of digital data values. A convolutional digital to analog converter is connected to the input means for receiving the plurality of digital data values. The convolutional digital to analog converter receives an offset current and a reference current. The convolutional digital to analog converter provides an analog output signal. The convolutional digital to analog converter includes a filter circuit for performing a convolution of the plurality of digital data values and a derivative of a desired impulse response of the data transmitter. The filter circuit is connected to the input circuit for receiving the plurality of digital data values and filter circuit provides an intermediate output signal. An integrator is connected to the filter circuit for receiving the intermediate output signal. The integrator integrates the intermediate output signal to provide the analog output signal having the desired impulse response of the data transmitter.

Furthermore, there is provided, in a third form, a method for implementing a data transmitter. The method includes the steps of receiving an input signal, calculating a convolution of the input signal and a derivative of the desired impulse response of the data transmitter using a filter circuit, and enabling the filter circuit to provide an intermediate output signal. The method also includes the step of integrating the intermediate output signal to provide an output signal having the desired impulse response of the data transmitter.

These and other features, and advantages, will be more clearly understood from the following detailed description taken in conjunction with the accompanying drawings.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
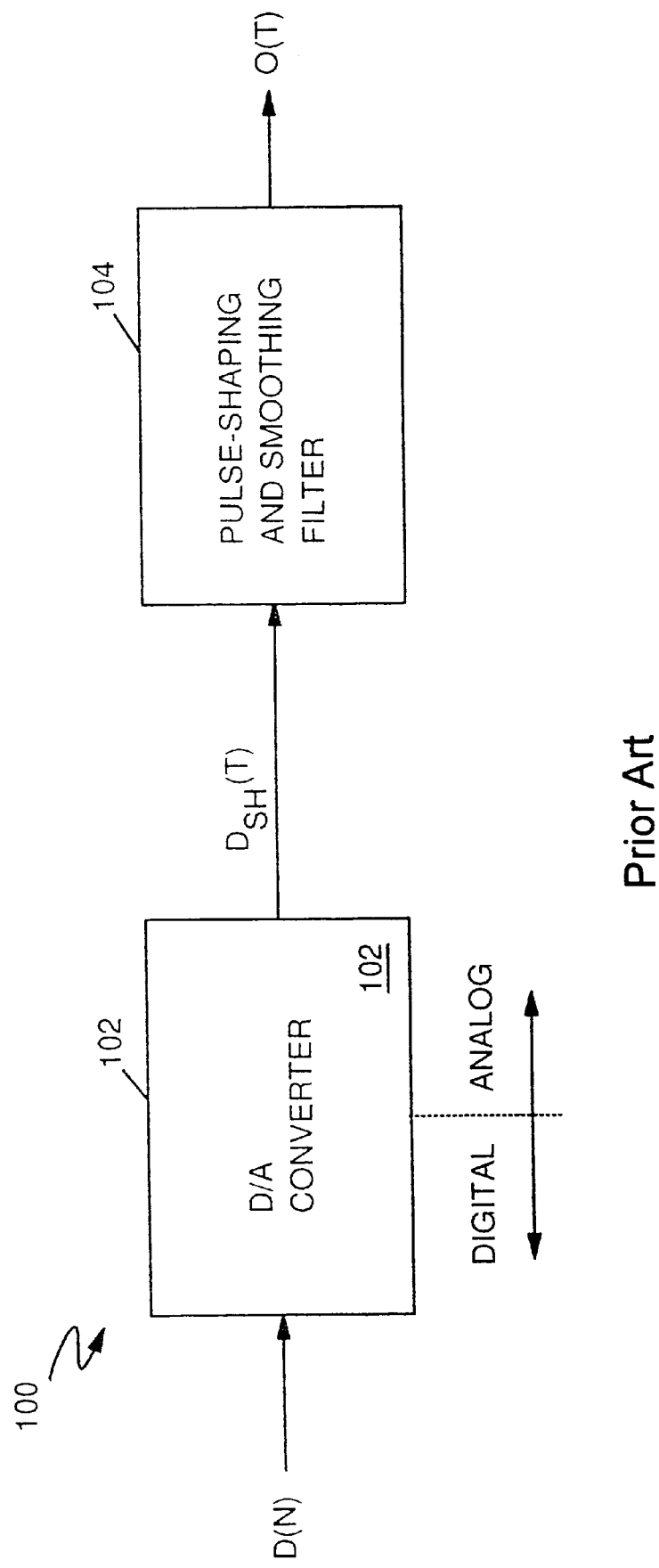
FIG. 1 illustrates, in block diagram form, a prior art data transmitter.

The present invention provides a data transmitter which performs digital to analog conversion, convolution with arbitrary finite impulse response, and smoothing of the output functions without requiring a separate anti-aliasing low pass filter. The present invention implements a unique data transmitter which shapes the impulse response, and hence the transfer function, of the data transmitter. To implement the unique data transmitter of the present invention, a digital input data value is convolved with the desired impulse response. The coefficients of the desired finite impulse response filter are chosen to create a first or second derivative of the desired output of the data transmitter. Then, the derivative is integrated so that a resulting signal output from the data transmitter is a smooth signal which does not require further filtering. The implementation of the present invention will subsequently be described in greater detail.

The present invention provides a data transmitter which uses an up-sampler, an analog FIR with weighted current switches, and integrators. Together, these components generate a desired impulse response of the data transmitter. Furthermore, in the present implementation of the invention, the impulse response coefficients used to generate the desired impulse response can be set to any level using current sources and do not have to be quantized. Therefore, the output of the data transmitter may be more accurate as the coefficients of the filter do not have to be discretized. Furthermore, the coefficients are pre-computed based on the number of integrations which are to be implemented in the transmitter to shape the desired impulse response without requiring additional digital to analog converters. By avoiding a need for an additional filter and the additional D/A converters required by prior art implementations, the complexity and power dissipation of the transmitter of the present invention is reduced.

During a following description of the implementation of the invention, numerous specific details are set forth such as specific word or byte lengths, etc. to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

Figure 2:
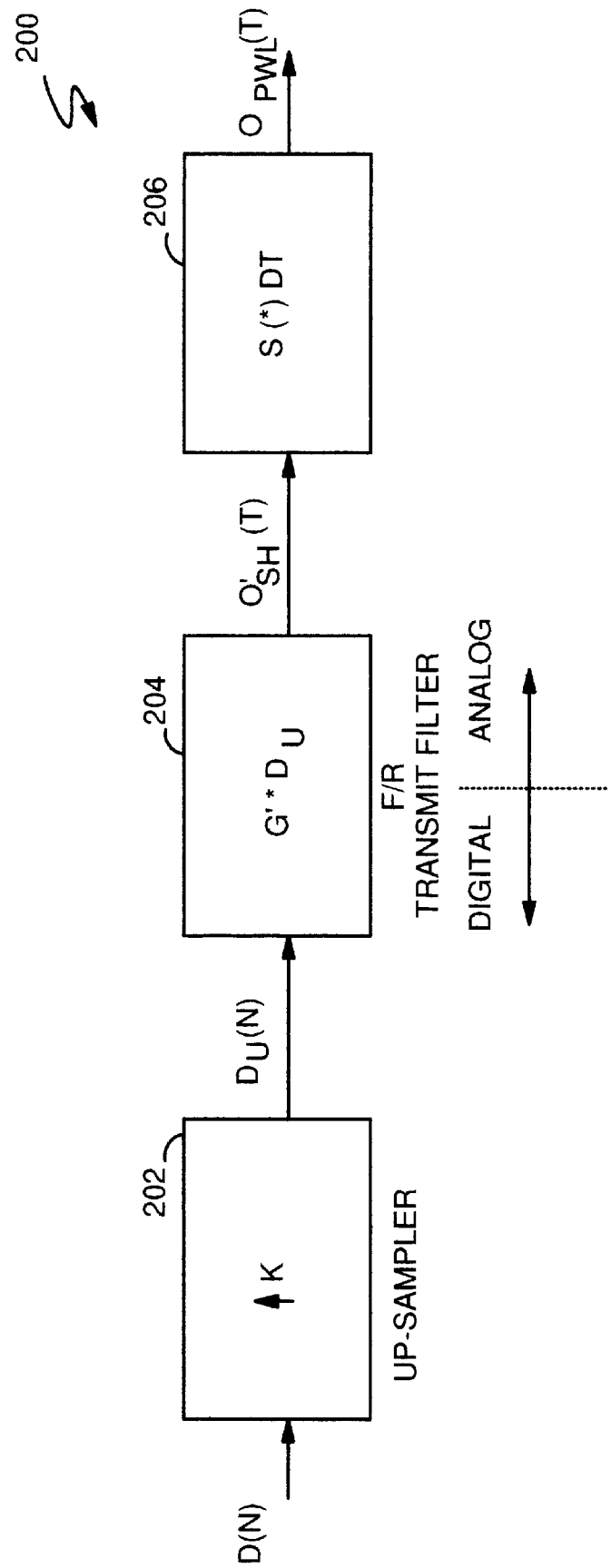
FIG. 2 illustrates, in block diagram form, a convolutional data transmitter with single integration in accordance with one embodiment of the present invention.
Figure 3:
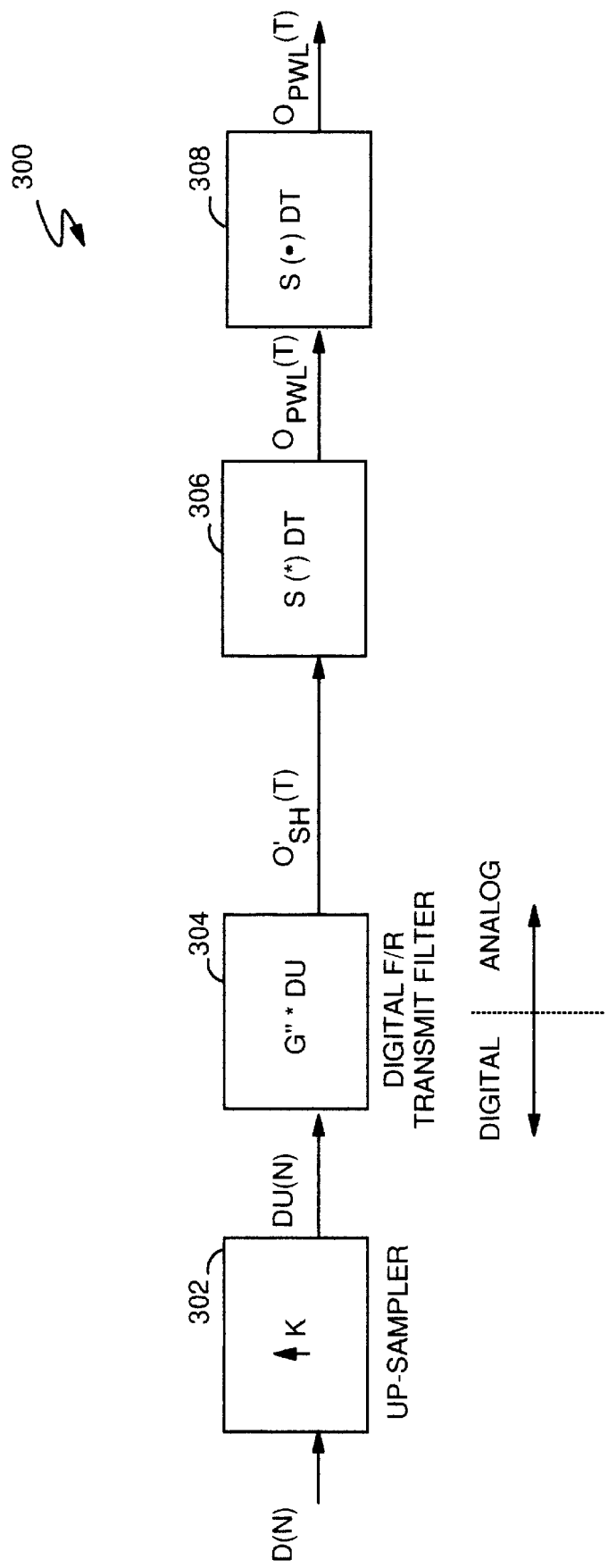
FIG. 3 illustrates, in block diagram form, a convolutional data transmitter with double integration in accordance with one embodiment of the present invention.

The present invention recognizes that a better approximation may be obtained by a data transmitter which uses a linear piece-wise approximation or an arcs of parabolas approximation to perform a convolution. Such approximations reduce the high frequency content of an input signal. To implement these approximations, a staircase approximation of the first or second derivative of the impulse response should be calculated. Subsequently, the approximation should be followed by one or two integrations of the staircase approximation. A conceptual diagram is illustrated in FIGS. 2 and 3, respectively for single and double integration. It should be noted that there should be a finite number of stairs provided to a converter which implements the methodology.

In each of FIGS. 2 and 3, D[n] is a one dimensional array representing a digital transmit data value. D[n] may also be referred to as a discrete time digital signal. The continuous time is referred to as t=nT, where T is a symbol rate, where symbol refers to a group of bits transmitted at one time. Furthermore, it should be noted that the index "n" is an integer. In each of FIG. 1 and 2, an up-sampler illustrated therein (302 and 202, respectively) has up-sampling rate of k, where k is an integer. Each of up-sampler 302 and 202 obtains an up-sampled signal, $D_u[n]$, by inserting k−1 zeros between adjacent samples. Furthermore, the transmit data D[n] has a discrete number of levels which are uniformly spaced and centered around 0.

$$D[n] \in \begin{cases} \{\pm 1, \pm 3, \pm 5, \ldots, M-1\} & \text{(Even number of levels } M\text{)} \\ \left\{0, \pm 1, \pm 2, \pm 3, \ldots, \dfrac{M-1}{2}\right\} & \text{(Odd number of levels } M\text{)} \end{cases} \quad (1)$$

Furthermore, the up-sampling operation always inserts a 0 in the transmit data, such that:

$$D_U[n] \in \begin{cases} \{0, \pm 1, \pm 3, \pm 5, \ldots, M-1\} & \text{(Even number of levels } M\text{)} \\ \left\{0, \pm 1, \pm 2, \pm 3, \ldots, \dfrac{M-1}{2}\right\} & \text{(Odd number of levels } M\text{)}. \end{cases} \quad (2)$$

Generally, a transmitter may be specified by its continuous time impulse response. By sampling the impulse response at a rate of k/T, a discrete time approximation of this impulse response is obtained, where k is the oversampling rate.

G'[n] coefficients are derived from a desired impulse response and are defined for $0 \leq n \leq N-1$. Furthermore, the G'[n] coefficients may be calculated by sampling the desired impulse response at a rate of $$\frac{k}{T},$$

and calculating a first difference. In the alternative, the G'[n] coefficients may be calculated by sampling the first-order derivative of the desired impulse response. Furthermore, a derivative of the G'[n] coefficients is referred to as the G"[n] coefficients. The G"[n] coefficients may be calculated in a similar manner using the second difference or a second-order derivative. The current weighting coefficients for implementing the present invention may be determined by taking a second order differential of certain time samples. The time samples are determined by sampling an impulse response at a rate of $$\frac{k}{T},$$

where
k is the over-sampling rate. For example, if:

G=[0 1 2 4 6 6.5 6 5 3.5 3 2 1 .5 0], then a first differential of this response is:

G'=[0 1 1 2 2 .5 −.5 −1 −1.5 −0.5 −1 −1 −.5 −.5].

The second differential is:

G"=[0 1 0 1 0 −1.5 −1 −.5 −.5 1 −.5 0 .5 0],

Assuming G' (1)=0 and G" (1)=0, where there are zero initial conditions.

Furthermore, during operation, a FIR transmit filter, such as 204 and 304 in FIGS. 2 and 3, respectively, may be used to perform a discrete time convolution of the up-sampled data, $D_U[n]$, with G'[n] or G"[n]. Each of the FIR transmit filters 204 and 304 also converts the output to analog continuous time outputs by converting the digital data to a continuous-time staircase current output by performing a sample-and-hold operation. The analog output is integrated once in the data transmitter of FIG. 2 and integrated twice in the data transmitter of FIG. 3. An output of digital FIR transmit filter 204 and 304 is:

$$x[m] = \sum_{n=0}^{N-1} (G'[n] \times D_U[m-n]) \quad (3)$$

where G'[m] is assumed to be causal. The term "causal" indicates that a system cannot respond at its output at an earlier time than its input is stimulated. Furthermore, if the sample-and-hold (SH) function is defined as:

$$SH(t, x[n]) = x[n]\left(\text{for}\frac{nT}{k} \leq t < \frac{(n+1)T}{k}\right), \quad (4)$$

the piece-wise linear output of the data transmitter of FIG. 2 may be denoted as:

$$O_{PWL}(t) = \int_0^t SH(\tau, x[n])d\tau = \int_0^t SH\left(\tau, \sum_{n=0}^{N-1}(G'[n] \times D_U[n-m])\right)d\tau. \quad (5)$$

Similarly, the piece-wise-parabolic output of the data transmitter of FIG. 3 is:

$$O_{PWP}(t) = \int_0^t \int_0^t SH\left(\tau, \sum_{n=0}^{N-1}(G''[n] \times D_U[m-n])\right)d\tau d\tau. \quad (6)$$

An example of a data transmitter for performing the functions described above is illustrated in greater detail in FIG. 4.

Figure 4:
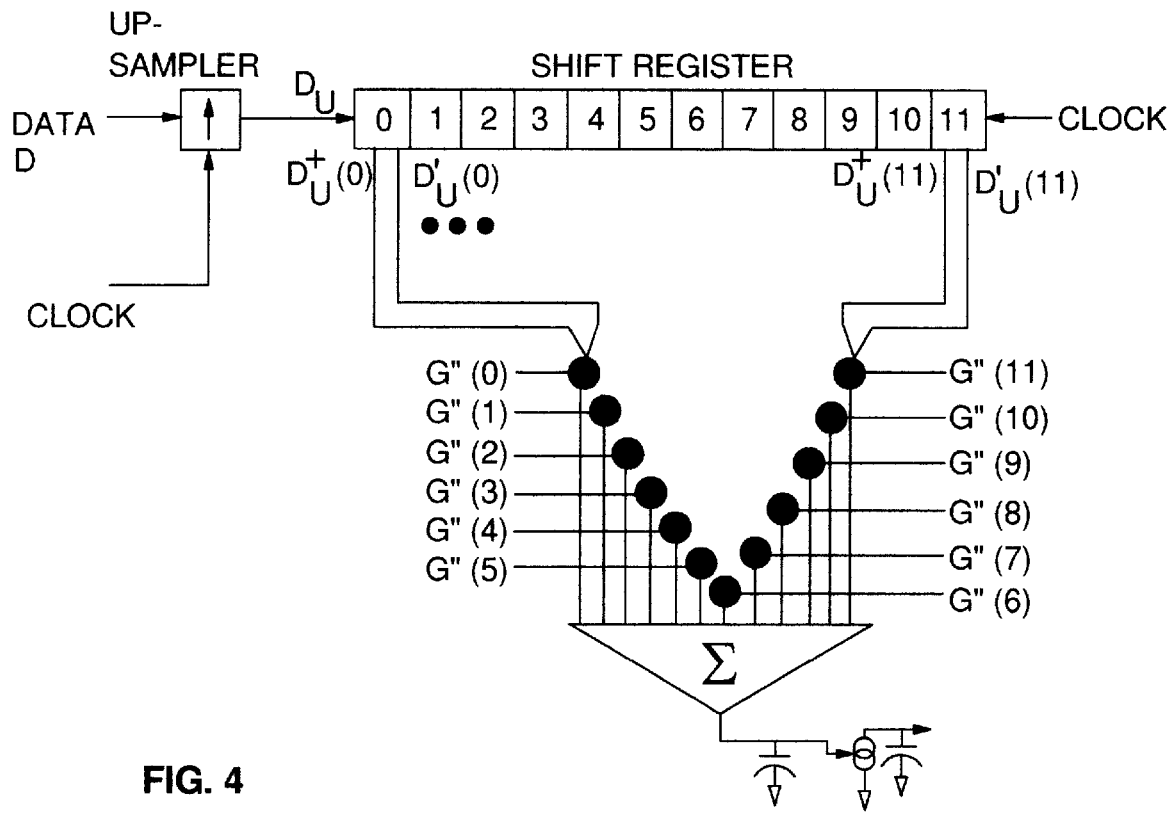
FIG. 4 illustrates, in block diagram form, a transmitter in accordance with one embodiment of the present invention.

FIG. 4 illustrates one embodiment of a data transmitter of the present invention. FIG. 4 illustrates data transmitter 400 for implementing the equations provided above. Transmitter 400 of FIG. 4 comprises a up-sampler circuit 402, a shift register 404, a plurality of multiplexers 406, a summation device 408, a capacitor 410, a current generator 412, and a capacitor 414.

Figure 5:
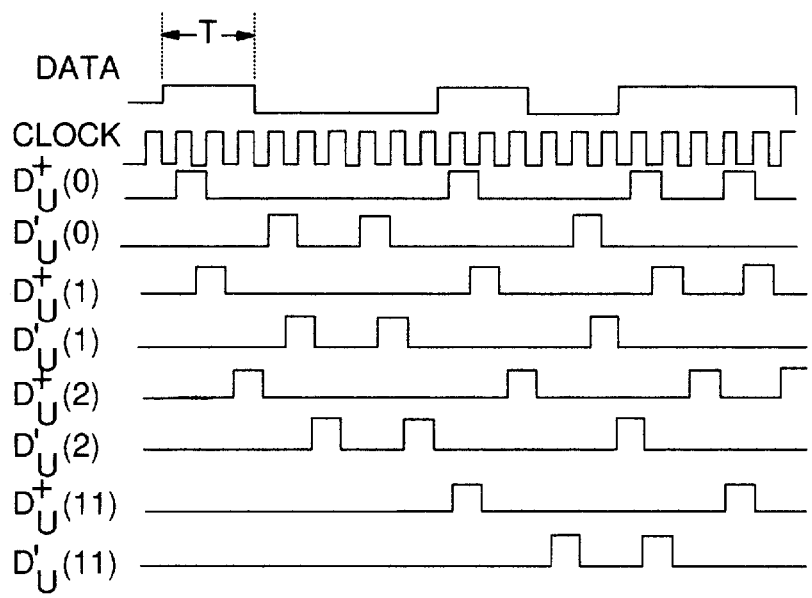
FIG. 5 illustrates, in timing diagram form, a timing relationship between each of the inputs to the transmitter of FIG. 4.

In transmitter 400, a data signal is input to up-sampler circuit 402. A clock signal is also input to up-sampler circuit 402. An output of up-sampler circuit 402 is coupled to shift register 404. The clock signal is also coupled to shift register 404. Each of the plurality of multiplexers 406 is coupled to a respective one of a plurality of bits in shift register 404. A plurality of corresponding weighting values, $G_{00}$" through $G_{32}$" are coupled to a respective one of the plurality of multiplexers 406. An output of each of the plurality of switched current sources 406 is provided to summation device 408. As previously described, these relative values are calculated based on the G" coefficients. Summation device 408 provides an output which is coupled to a first input of capacitor 410 and a control input of current generator 412. A second reference voltage of capacitor 410 is coupled to a ground voltage. Similarly, a reference voltage of voltage controlled current source 412 is coupled to the ground reference voltage. A second end of voltage controlled current source 412 provides an output signal. Capacitor 414 has a first input coupled to receive the output signal and a second input coupled to receive the ground reference voltage. Additionally, FIG. 5 illustrates a timing diagram which corresponds to each of the data and clock inputs to transmitter 400 of FIG. 4.

During operation of transmitter 400, a plurality of data signals and a clock signal are provided to up-sampler 402. During operation of transmitter 400, an impulse response has a duration of four time (4T) units and three time slices during a data time unit. Assume, in this example describing operation of transmitter 400, that each of the data values transferred via the data signal is "T" spaced data and the clock signal has a frequency of $$\frac{3}{T}.$$

After up-sampler 402 has detected a rising edge of a data signal, up-sampler 402 waits for a next rising edge of the clock signal. On this next rising edge of the clock signal, an output of up-sampler 402 transitions to a high logic level. On a next rising edge of the clock signal, the output of up-sampler 402 will transition to a logic low level. Subsequently, up-sampler 402 waits for a next rising edge of the data signal to repeat the steps described above.

In executing these operations, up-sampler 402 effectively performs an up-sampling operation. Therefore, $D_u[n]$ has three values, +1, −1, and 0. In the embodiment of the invention described herein, a "+1" level propagates a positive impulse and a "−1" level propagates a negative impulse. In FIG. 4, the "−1" levels are denoted by variables having a minus, such as $D_u$–[32] and $D_u$–[11]. Up-sampler, therefore, produces data pulses, $D_u$, which have a width of $$\frac{T}{3}$$

for input to shift register 404. Furthermore, these produced pulses will propagate through shift register 404 at a rate of $$\frac{3}{T}.$$

Shift register 404 provides a plurality of outputs which are used to control the plurality of current switches 406 with an output current of +G", −G", and 0. When enabled, each of the plurality of current switches 406 provides a current value to summation device 408. A value of the current is set by the G[x]" coefficients provided thereto by a current source which can be set to any value to obtain a desired impulse response. Such current sources will subsequently be described in greater detail. Therefore, during operation, each of the plurality of current switches 406 selectively provides a positive current value, a negative current value, or a zero value as determined by the value of the D[x] and D[x]− signals provided thereto.

To provide a slightly more detailed description, an output of the plurality of current switches 406 is coupled to summation device 408. A sum output from summation device 408 is integrated using capacitor 410. Subsequently, the voltage is provided to voltage controlled current source 412 and a second integration operation is performed using capacitor 414. By providing data and clock signals to the circuitry described above, the summing and integration necessary to shape the output data to a desired impulse response is performed.

Figure 6:
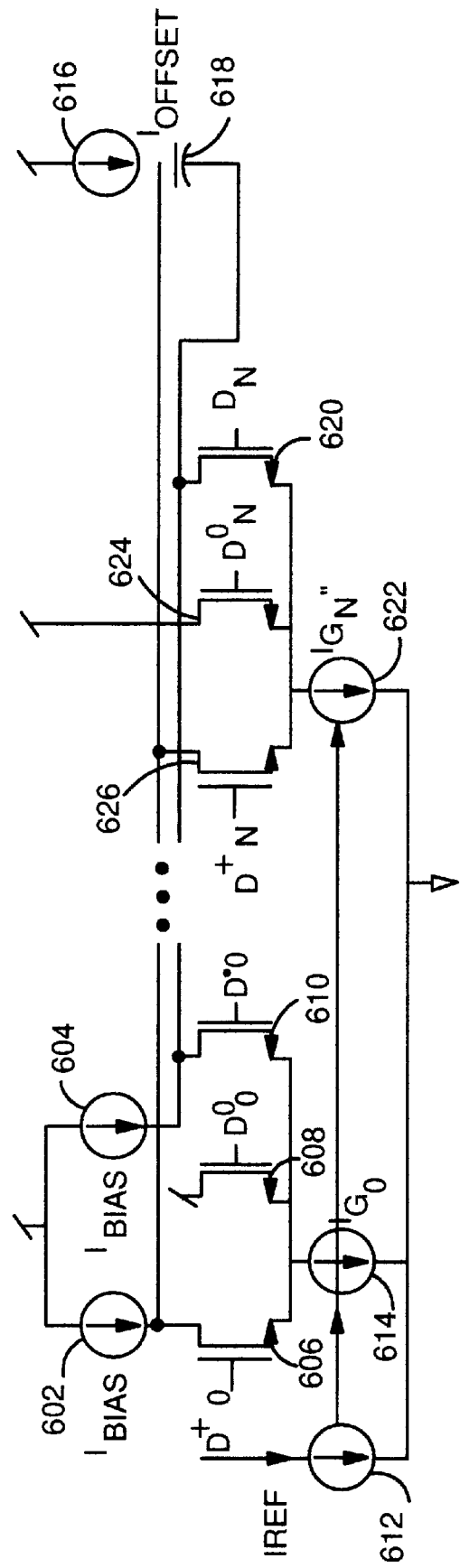
FIG. 6 illustrates, in logic diagram form, a plurality of ternary weighted current sources in accordance with one embodiment of the present invention.

It should be noted that there are several methods for implementing the ternary current source weights. For example, the transmitted data signal may be single-ended or differential. FIG. 6 illustrates a plurality of current switches 600. Each of the plurality of current switches comprises a current source 602, a current source 604, a transistor 606, a transistor 608, a transistor 610, and a current source 614. FIG. 6 illustrates one embodiment of the present invention and a configuration of this embodiment will subsequently be described in greater detail. A reference current (Iref) is provided to current source 612. Current source 612 provides a control input to each of current sources 614 and 622. An output of current source 612 is coupled to an output of current source 614 and an output of current source 622. Each of the outputs of current sources 612, 614, and 622 is coupled to a reference ground voltage. The control signals $D_0^+$, $D_0^0$, and $D_0^-$ that control the current sources are generated from the up-sampled data signal, D", according to the following Table 1:

TABLE 1

| $D_u$ | $D_u^+$ | $D_u^-$ | $D_u^0$ |
|---|---|---|---|
| +1 | 1 | 0 | 0 |
| −1 | 0 | 1 | 0 |
| 0 | 0 | 0 | 1 |

A first electrode of transistor 608 is coupled to a reference voltage and a second electrode of transistor 608 is coupled to an input to current source 614. An input for each of current sources 602 and 604 is coupled to a reference voltage. An output of current source 602 is coupled to a first electrode of transistor 606 and a subsequent electrode in an adjacent current source implementation. A $D_0^+$ signal is coupled to a control terminal of transistor 606. Similarly, a $D_0^-$ signal is coupled to a control electrode of transistor 610. An output of current source 604 is coupled to a first electrode of transistor $D_0^-$. Each of the elements 602, 604, 606, 608, 610 and 614 implements a current switch. It should be noted that each of current sources 602 and 604 provides an $I_{bias}$ current. With respect to a last one of a plurality of current switches 600, a current source 616 provides a $I_{offset}$ current to a first terminal of capacitor 618. A second electrode of capacitor 618 is coupled to a first electrode of transistor 620.

The plurality of differential current switches 600 implemented in FIG. 6 utilize common—common mode feedback to set a bias current, $I_{bias}$. Additionally, a shift register provides a complementary output of an input signal. Furthermore, during operation of each of the plurality of current switches 600, each of the current sources is set by a mirror of a reference current source, Iref.

It should be noted that each register in a plurality of shift registers of transmitter of the present invention controls a current switch. For example, refer to FIG. 11 which implements a plurality of shift registers 1104–1108. Refer now to FIG. 6, wherein a current reference, Iref, establishes a relative amplitude of the current outputs. This current is provided to a current mirror that produces several current outputs 614–622. It should be noted that the plurality of current outputs 614–622 have a current which is a multiple of the reference current, Iref. A value of each of the currents 614–622 represents a coefficient of a filter function, $G_{00}$ through $G_{32}$. Furthermore, each of the plurality of currents 614–622 is switched so that either a positive current pulse, a negative current pulse, or zero current pulse is summed on capacitor 1112 (of FIG. 11). At an output, two bias currents are required to provide an average current needed to stabilize a common mode output voltage of the current switches. Additionally, because operations may result in large differential offsets at an output, a "i" offset current is required to rectify this issue. The "i" offset current is generated by an offset correction loop. Specifically, the "i" offset is generated by low pass filtering an output signal to generate a DC error voltage, comparing this error voltage with zero, and then amplifying it to generate the i offset value.

Figure 7:
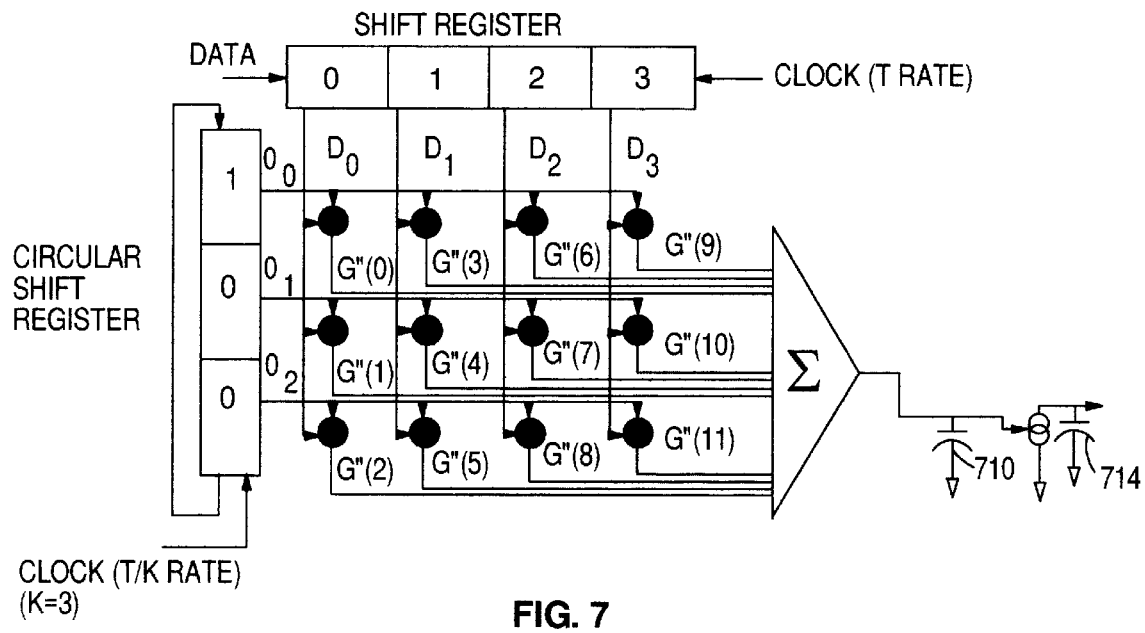
FIG. 7 illustrates, in block diagram form, a transmitter in accordance with one embodiment of the present invention.
Figure 8:
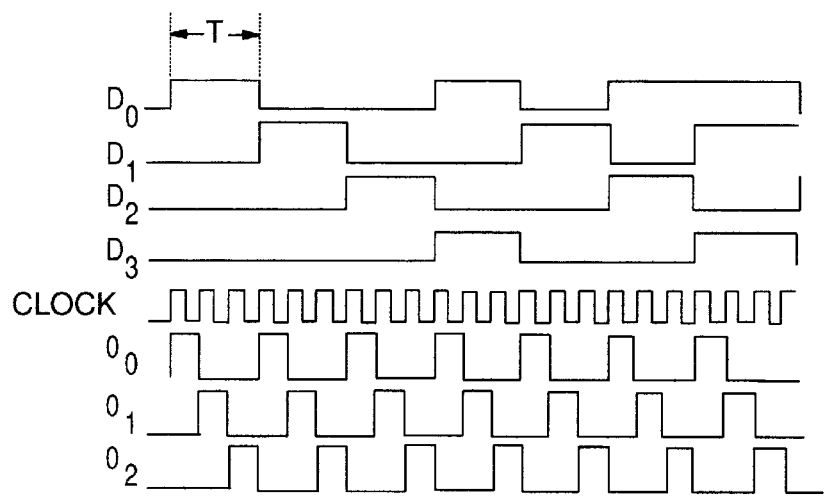
FIG. 8 illustrates, in timing diagram form, a timing relationship for the inputs and outputs of the transmitter of FIG. 7.

There are several other methods for implementing a convolutional data transmitter such as that of the present invention. Another implementation of a binary data transmitter which eliminates an up-sampler, and allows a T-spaced shift register for the data and a $$\frac{T}{k}$$

spaced circular shift register to generate clock phases is illustrated in FIG. 7. A timing diagram illustrated in FIG. 8 provides operation information for the transmitter of FIG. 7. The current switches are implemented as illustrated in FIG. 6 and the truth table for the logic control of the ternary current switch for this implementation is illustrated in Table 2:

TABLE 2

| $D_u$ | Ø | $D^+_u$ | $D^-_u$ | $D^0_u$ |
|---|---|---|---|---|
| +1 | 1 | 1 | 0' | 0 |
| −1 | 1 | 0 | 1 | 0 |
| x | 0 | 0 | 0 | 1 |

In FIG. 7, the data enters the T-spaced shift register at a Rate of T and it propagates through the shift register at a rate of T. The circular shift register has all of its registers except for one set to zero. The outputs are at a frequency of 1/T and a pulse width of T/k. Each of the outputs are offset by T/k in time. The circular shift register and the shift register are in synchronization so that the rising edge of D0 and $Ø_0$ occur simultaneously. The multiplexors in this system have two inputs and a single output. The control of the current switches is generated, as illustrated in Table 2. The current switches can be implemented with ternary current switches as illustrated in FIG. 6. All of the currents are summed and integrated in the same way as the implementation illustrated in FIG. 4.

Furthermore, it is possible to replace the ternary current sources implemented herein with binary current sources. In some cases, this replacement may simplify the transmitter and is implemented in accordance with one embodiment of the present invention. To illustrate this simplification, consider a binary transmitter. The set of output currents for each ternary current source is:

$$G''[n] \times D_U[n] \in \{G'', 0, -G''\}. \tag{7}$$

Each ternary current source can be replaced with two binary current sources. A truth table and an output current for each current source is illustrated in Table 3.

TABLE 3

| $D_U$ | $D^A$ | $D^B$ | $2G''D^A + G''D^B − G''$ |
|---|---|---|---|
| +1 | 1 | 0 | G'' |
| 0 | 0 | 1 | 0 |
| −0 | 0 | 0 | −G'' |

Figure 9:
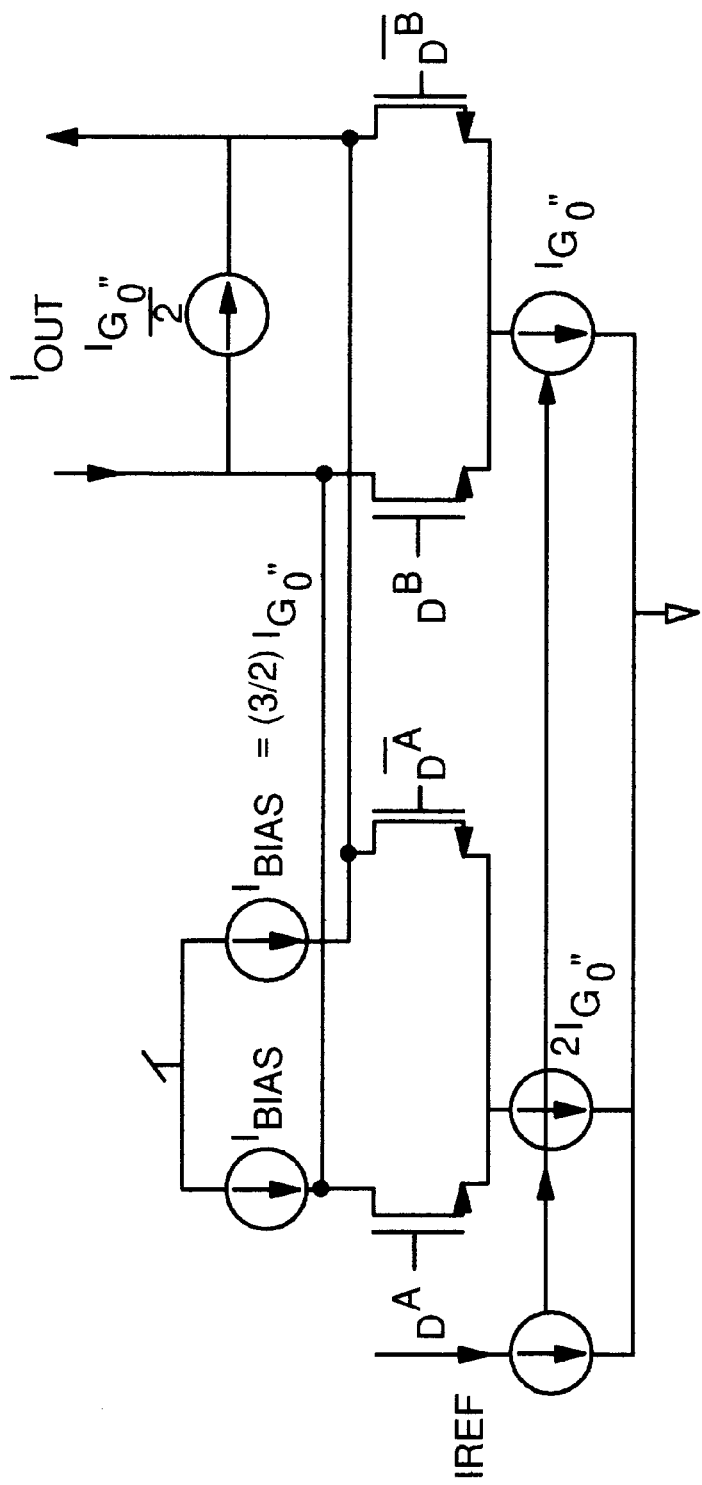
FIG. 9 illustrates, in circuit diagram form, a differential ternary weighted current cell implemented with two binary weighted current sources.

In Table 3, notice that one of the binary current sources is twice the other and a DC current must be subtracted from the output. Furthermore, it should be noted that the differential binary current cell of FIG. 9 may be used to implement transmitters such as those illustrated in FIG. 4 and FIG. 7. In FIG. 9 the two binary current sources are implemented with two differential current switches. The outputs of the currents are summed by connecting the two current switches together. The bias currents are controlled with common mode feedback. An offset voltage is subtracted from the output. This circuit implements the current generator described in Table 3.

Figure 11:
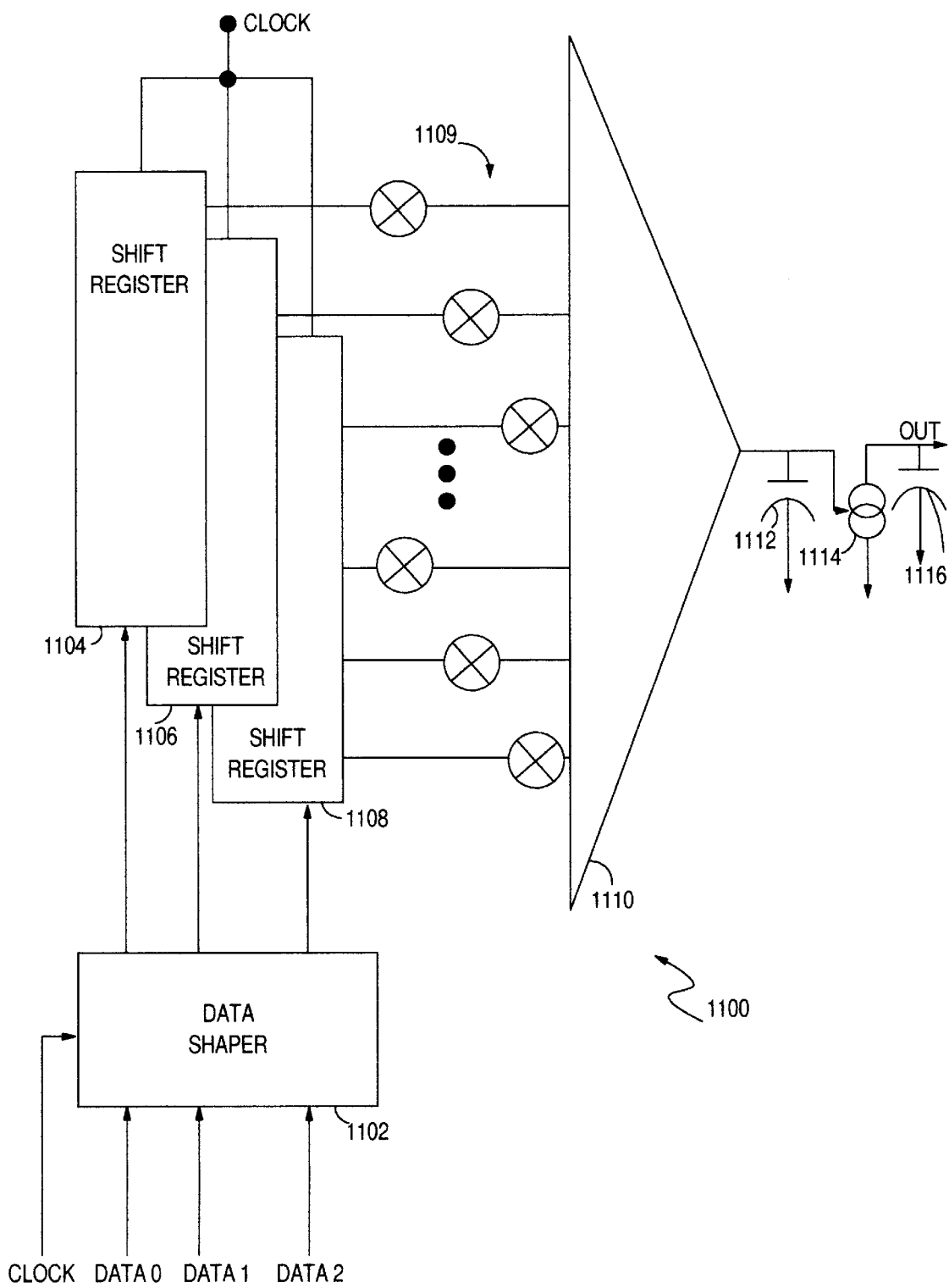
FIG. 11 illustrates, in block diagram form, a multi-level transmitter in accordance with one embodiment of the present invention.

It should be noted that many transmitters transmit multi-level, rather than binary, symbols to reduce the bandwidth requirement of a communication channel. As with a binary transmitter, the multi-level transmitters output should also be filtered. For example, multi-level transmitter 1100 may be implemented by placing several of the binary transmitters in parallel, and summing the currents from all of the currents, as illustrated in FIG. 11. In an example, assume that Data2 is the most significant bit in a data value and multi-level transmitter 1100 is an 8-level transmitter. It should be noted that multi-level wave-shaping transmitter 1100 of FIG. 11 functions in a manner similar to transmitter 400 of FIG. 4.

FIG. 11 illustrates a multi-level wave-shaping transmitter implemented in accordance with one embodiment of the present invention. Multi-level wave-shaping transmitter 1110 comprises a up-sampler 1112, a shift register 1114, a shift register 1106, a shift register 1108, a summation device 1110, a plurality of current switches 1109, a capacitor 1112, a current source 1114, and a capacitor 1116.

A clock signal is provided to each of up-sampler 1102, shift register 1104, shift register 1106, and shift register 1108. A Data 0 signal is provided to up-sampler 1102. Up-sampler 1102 passes a modified Data 0 signal to shift register 1104. A Data1 signal is also provided to up-sampler 1102. In turn, up-sampler 1102 provides a modified Data1 signal to shift register 1106. Furthermore, a Data2 signal is provided to up-sampler 1102. As before, up-sampler 1102 provides a modified Data2 signal to shift register 1108. Each of the outputs of shift register 1104, shift register 1106, and shift register 1108 is provided to a portion of a plurality of current switches 1109. Outputs of each of the plurality of current switches 1109 is provided to summation device 1110. An output of summation device 1110 is provided to capacitor 1112 and a control input of current source 1114. A second end of capacitor 1112 is coupled to a reference ground voltage. Similarly, a first end of current source 1114 is coupled to a reference ground voltage and a second end of current source 1114 is coupled to a first terminal of capacitor 1116. The first terminal of capacitor 1116 provides the Out signal and a second terminal of capacitor 1116 is coupled to a reference ground voltage.

For example, to obtain a transmitter with "m" transmit levels, log m parallel structures and a common integration section should be implemented. In the embodiment of the invention illustrated in FIG. 11, an 8-level transmitter is implemented. Furthermore, by setting the distances between the levels of multi-level wave-shaping transmitter 1100 to be equal, then the weights of the impulse responses are scaled with binary weights. For example, $2 \times G0_{00} = G1_{00}$ and $4 \times G0_{00} = G2_{00}$.

Binary current sources similar to that illustrated in FIG. 9, may be implemented for a multi-level transmitter such as that illustrated in FIG. 11. For example, for a 4-level transmitter, three binary current sources may be implemented for each filter coefficient, rather than placing two structures with ternary current sources in parallel. After performing an up-sampling operation, a simple set of data to be transmitted is $D_U$ being a subset of [0, ±1, ±3]. A truth table for this function is illustrated below in Table 4.

TABLE 4

| $D_U$ | $D^A$ | $D^B$ | $D^C$ | 4G"$D^A$ + 2G"$D^B$ + G"$D^C$ − 3G" |
|---|---|---|---|---|
| +3 | 1 | 1 | 0 | +3G" |
| +1 | 1 | 0 | 0 | +G" |
| 0 | 0 | 1 | 1 | 0 |
| −1 | 0 | 1 | 0 | −G" |
| −3 | 0 | 0 | 0 | −3G" |

Table 4 is an extension of Table 3 which illustrates how to implement a four level transmitter with three binary weighted current sources. The input symbols, after the up-sampling operation, are $DU_1$ with $D^A$, $D^B$, and $D^C$ being generated based on each transit signal $D_U$. The output current is then generated from the three binary current switches. The value of each current source for each current switch is scaled by binary factors (G", 2G", and 4G"). The output is then a summation of all the current switches, and subtraction of a DC current 3G".

In general, a number of binary or ternary current sources required to implement a transmitter with M transmit levels is:

$$\text{Ternary Current Sources} = \begin{cases} \lceil \log_2(M) \rceil, & M \text{ Even} \\ \lceil \log_2(M) \rceil - 1, & M \text{ Odd} \end{cases} \quad (8)$$

$$\text{Binary Current Sources} = \begin{cases} \lceil \log_2(M) \rceil + 1, & M \text{ Even} \\ \lceil \log_2(M) \rceil, & M \text{ Odd} \end{cases}$$

where the $\lceil \; \rceil$ operator rounds up to the nearest integer.

Since the output of this transmitter is capacitive, the output signal must be buffered before it is transmitted onto an output line. Therefore, the output signal should be buffered before it is transmitted onto a transmission line to prevent loading of the transmission media (cable) from interfering with an integration operation and distorting the signal. Furthermore, a terminating resistor may be used to match the impedance of the media.

Traditionally, conventional transmitters use resistors as loads, rather than the capacitors utilized in the present invention. In such cases, a reference current which is used to generate current switches has a value of $$\frac{V_{REF}}{R},$$

where $V_{REF}$ is a reference voltage obtained from an accurate band-gap reference and R is a resistor built in a same manner as a pull-up resistor in a D/A converter. In the traditional case, an amplitude of the signal provided by the D/A converter is proportional to the band-gap voltage and a ratio of two resistors. One method of obtaining such accurate output amplitudes is to design a circuit that generates a current which is proportional to a product of an accurate frequency, an accurate voltage, and a capacitor. These three components are generally available on any transmitter integrated circuit. Additionally, the current may be generated with a current controlled oscillator in a frequency-locked loop or a current controlled delay element in a delay-locked loop. However, these circuits may be complex and may have a mistracking error. Additionally, another method for generating a current is through the use of an automatic gain control loop which measures an amplitude of the transmitted waveform, compares the amplitude to a reference amplitude, and provides, as feedback, an error signal to force the transmit amplitude to be equal to the reference amplitude.

Figure 10:
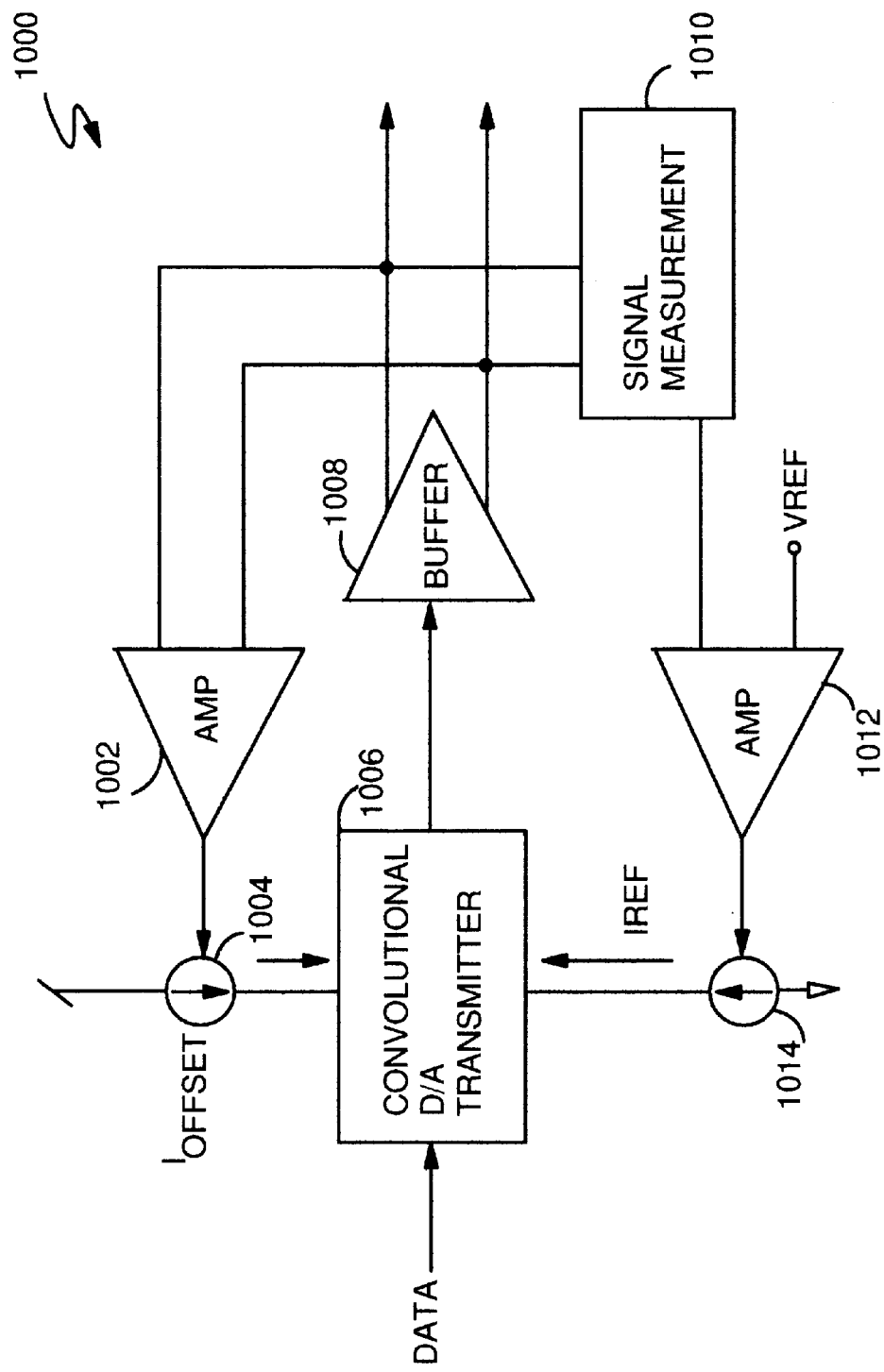
FIG. 10 illustrates, in block diagram form, a transmitter with an output buffer, offset and amplitude control in accordance with one embodiment of the present invention.

FIG. 10 illustrates a transmitter with buffer and amplitude control circuits that may be used to perform an accurate transmission operation.

FIG. 10 illustrates a transmitter 1000. Transmitter 1000 comprises an amplifier 1002, a current source 1004, a convolutional D/A transmitter 1006, a buffer 1008, a signal measurement circuit 1010, an amplifier 1012, and a current source 1014. An input to current source 1004 is connected to a reference voltage. An output of current source 1004 is coupled to a first input of convolutional D/A transmitter 1006. A data signal is coupled to a second input of convolutional D/A transmitter 1006. An output of current source 1013 is coupled to a third input of convolutional D/A transmitter 1006 to provide an Iref signal. An output of convolutional D/A/ transmitter 1006 is coupled to an input of buffer 1008. A first output of buffer 1008 is coupled to a first input of amplifier 1002 and a first input of signal measurement circuit 1010. A second output of buffer 1008 is coupled to a second input of signal measurement circuit 1010 and the second input of amplifier 1002. An output of signal measurement circuit 1010 is coupled to a first input of amplifier 1012. A $V_{REF}$ value is coupled to a second input of amplifier 1012. An output of amplifier 1012 is coupled to a control input of current source 1014. A second input to current source 1014 is coupled to a reference ground voltage.

In transmitter 1000 of FIG. 10, the signal measurement circuit measures an amplitude of a transmitted signal. Therefore, signal measurement circuit 1010 may be implemented as a peak-detector or a RMS voltage detector, for example. An output of amplifier 1012 is used to control a reference current (Iref) which is used to scale all of the current sources which represent coefficients of a filter. Since the output of the transmitter has a capacitive load any small offset in the current sources will get integrated producing a very large output offset voltage. This output offset voltage can cause the output to saturate severely degrading the performance of the transmitter. For this reason, a low frequency offset-canceling loop should be used.

FIG. 10 illustrates two control loops. One control loop controls an average differential mode output voltage (offset) and the other loop controls an energy of a transmitted signal. A top loop is formed by amplifier 1002 and current source 1004. This top loop is an offset cancelling loop. A bottom loop, the amplitude control loop, is formed by amplifier 1012 and current source 1014. Amplifier 1002 has a very low bandwidth so that it can measure an average output amplitude over a long period of time. A result of this lengthy averaging is that the effect of a high frequency data signal is "averaged out." An output of amplifier 1002 is then an amplified error signal which represents a DC offset at an output of transmitter 1000. The feedback loop to amplifier 1002 forces this DC offset to be 0. Signal measurement device 1010 in the amplitude control loop has a high bandwidth. An output of signal measurement device 1010 is the measure of the peak-to-peak, or RMS of the signal being transmitted. Amplifier 1012 has a very low bandwidth so that the feedback loop will force the average peak-to-peak, or RMS to be equal to a reference voltage, $V_{REF}$.

While there have been described herein the principles of the invention, it is to be clearly understood to those skilled in the art that this description is made by way of example only and not as a limited to the scope of the invention. Accordingly, it is intended, by the appended claims, to cover all modifications of the invention which fall within the true spirit and scope of the invention.

What is claimed is:

1. A data transmitter, comprising:
   an input circuit for receiving an input signal;
   a filter circuit for performing a convolution of the input signal using a second derivative of a desired impulse response of the data transmitter, the filter circuit being coupled to the input circuit for receiving the input signal and the filter circuit providing an intermediate output signal; and
   an integrator coupled to the filter circuit for receiving the intermediate output signal, the integrator integrating the intermediate output signal to provide an output signal having the desired impulse response of the data transmitter.

2. The data transmitter of claim 1 wherein the input signal is a digital signal.

3. The data transmitter of claim 2 wherein the intermediate output signal is an analog signal.

4. The data transmitter of claim 1 wherein the desired impulse response of the data transmitter is represented by plurality of weighting factors.

5. The data transmitter of claim 4 wherein the filter circuit comprises:
   a plurality of current sources coupled to the input circuit for receiving the input signal and receiving the plurality of weighting factors, the plurality of current sources each providing one of a plurality of current values; and
   a summation device coupled to the plurality of current sources for receiving the plurality of current values, the summation device providing a sum current value.

6. The data transmitter of claim 5, wherein the integrator comprises:
   a first capacitor coupled to the summation device for receiving the sum current value, wherein the first capacitor integrates the sum current value to provide a first integrated sum current value.

7. The data transmitter of claim 6, wherein the integrator further comprises:
   a current generator coupled to the first capacitor to receive the first integrated sum current value, the current generator providing an output; and
   a second capacitor coupled to the current generator for receiving the output, wherein the second capacitor integrates the output to provide an impulse response value.

8. The data transmitter of claim 5 wherein each of the plurality of current sources is a ternary current source.

9. The data transmitter of claim 5 wherein each of the plurality of current sources is a binary current source.

10. A data transmitter, comprising:
    input means for receiving a plurality of digital data values;
    a convolutional digital to analog converter coupled to the input means for receiving the plurality of digital data values, the convolutional digital to analog converter receiving an offset current and a reference current, the convolutional digital to analog converter providing an analog output signal, and the convolutional digital to analog converter comprising:
       a filter circuit for performing a convolution of the plurality of digital data values and a derivative of a desired impulse response of the data transmitter, the filter circuit being coupled to the input circuit for receiving the plurality of digital data values and the filter circuit providing an intermediate output signal; and
       an integrator coupled to the filter circuit for receiving the intermediate output signal, the integrator integrating the intermediate output signal to provide the analog output signal having the desired impulse response of the data transmitter;
    an output buffer for providing the analog output signal;
    a signal measurement circuit coupled to the output buffer for receiving the analog output signal, the signal measurement circuit measuring an amplitude of the analog output signal and providing a measurement signal in response thereto;
    an offset canceling circuit coupled to the signal measurement circuit to receive the measurement signal, the offset current source generating the offset current in response thereto; and
    an amplitude control circuit coupled to the signal measurement circuit to receive the measurement signal, the reference current source generating the reference current in response thereto.

11. The data transmitter of claim 10 wherein the derivative is a first derivative of the desired impulse response of the data transmitter.

12. The data transmitter of claim 10 wherein the derivative is a second derivative of the desired impulse response of the data transmitter.

13. The data transmitter of claim 10 wherein the desired impulse response of the data transmitter is represented by plurality of weighting factors.

14. The data transmitter of claim 13 wherein the filter circuit comprises:
    a plurality of current sources coupled to the input circuit for receiving the input signal and receiving the plurality of weighting factors, the plurality of current sources each providing one of a plurality of current values; and
    a summation device coupled to the plurality of current sources for receiving the plurality of current values, the summation device providing a sum current value.

15. The data transmitter of claim 14, wherein the integrator comprises:
    a first capacitor coupled to the summation device for receiving the sum current value, wherein the first capacitor integrates the sum current value to provide a first integrated sum current value.

16. The data transmitter of claim 15, wherein the integrator further comprises:
    a current generator coupled to the first capacitor to receive the first integrated sum current value, the current generator providing an output; and
    a second capacitor coupled to the current generator for receiving the output, wherein the second capacitor integrates the output to provide an impulse response value.

17. The data transmitter of claim 14 wherein each of the plurality of current sources is a ternary current source.

18. The data transmitter of claim 14 wherein each of the plurality of current sources is a binary current source.

19. A method for implementing a data transmitter, comprising the steps of:
    receiving an input signal;
    performing a convolution of the input signal and a second derivative of a desired impulse response of the data transmitter using a filter circuit;
    enabling the filter circuit to provide an intermediate output signal; and
    integrating the intermediate output signal to provide an output signal having the desired impulse response of the data transmitter.

20. The method of claim 19, wherein the input signal is a digital signal.

21. The method of claim 20 wherein the intermediate output signal is an analog signal.

22. The method of claim 19 wherein the desired impulse response of the data transmitter is represented by plurality of weighting factors.

23. The method of claim 22, further comprising the steps of:
   enabling a plurality of current sources to provide one of a plurality of current values; and
   logically combining the plurality of current values to provide a sum current value.

24. The method of claim 23 wherein each of the plurality of current sources is a ternary current source.

25. The method of claim 23 wherein each of the plurality of current sources is a binary current source.

26. The method of claim 19, further comprising the steps of:
   coupling a first capacitor to the summation device to receiving the sum current value; and
   enabling the first capacitor to integrates the sum current value to provide a first integrated sum current value.

27. The method of claim 26, further comprising the steps of:
   coupling a current generator to the first capacitor to receive the first integrated sum current value;
   enabling the current generator providing an output;
   coupling a second capacitor coupled to the current generator for receiving the output; and
   enabling the second capacitor to integrate the output to provide an impulse response value.

* * * * *